(12) United States Patent
Lu et al.

(10) Patent No.: US 10,665,678 B2
(45) Date of Patent: May 26, 2020

(54) TRANSISTOR WITH FLUORINATED GRAPHENE SPACER

(71) Applicant: QUALCOMM Incorporated, San Diego, CA (US)

(72) Inventors: Ye Lu, San Diego, CA (US); Junjing Bao, San Diego, CA (US); Bin Yang, San Diego, CA (US); Lixin Ge, San Diego, CA (US); Yun Yue, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/288,558

(22) Filed: Feb. 28, 2019

(65) Prior Publication Data

US 2019/0221645 A1   Jul. 18, 2019

Related U.S. Application Data

(62) Division of application No. 15/672,017, filed on Aug. 8, 2017, now Pat. No. 10,263,080.

(60) Provisional application No. 62/510,487, filed on May 24, 2017.

(51) Int. Cl.
| | | |
|---|---|---|
| *H01L 21/02* | (2006.01) | |
| *H01L 29/16* | (2006.01) | |
| *H01L 29/66* | (2006.01) | |
| *H01L 29/78* | (2006.01) | |
| *H01L 29/10* | (2006.01) | |
| *H01L 29/72* | (2006.01) | |

(52) U.S. Cl.
CPC .... *H01L 29/1606* (2013.01); *H01L 21/02115* (2013.01); *H01L 21/02181* (2013.01); *H01L 21/02271* (2013.01); *H01L 29/1004* (2013.01); *H01L 29/1608* (2013.01); *H01L 29/66037* (2013.01); *H01L 29/6656* (2013.01); *H01L 29/66068* (2013.01); *H01L 29/72* (2013.01); *H01L 29/785* (2013.01)

(58) Field of Classification Search
CPC .......................... H01L 21/02115; H01L 29/16
See application file for complete search history.

(56) References Cited

U.S. PATENT DOCUMENTS

| | | | |
|---|---|---|---|
| 7,319,618 | B2 | 1/2008 | Wu et al. |
| 8,361,853 | B2 | 1/2013 | Cohen et al. |
| 9,064,964 | B2 | 6/2015 | Moon |
| 2006/0220152 | A1 | 10/2006 | Huang et al. |
| 2013/0252430 | A1 | 9/2013 | Ranjan et al. |
| 2015/0069473 | A1 | 3/2015 | Glass et al. |
| 2015/0162416 | A1 | 6/2015 | Chang et al. |

(Continued)

OTHER PUBLICATIONS

Ho K-I., et al., "Fluorinated Graphene as High Performance Dielectric Materials and the Applications for Graphene Nanoelectronics", Scientific Reports, vol. 4, Jul. 31, 2014, XP055281569, DOI: 10.1038/srep05893, 7 pages.

(Continued)

*Primary Examiner* — Douglas M Menz
(74) *Attorney, Agent, or Firm* — Qualcomm Incorporated/Seyfarth Shaw LLP

(57) ABSTRACT

An integrated circuit (IC) device may include a semiconductor structure. The semiconductor structure may include a source contact, a drain contact, and a gate. A first fluorocarbon spacer may be between the gate and the source contact. A second fluorocarbon spacer may be between the gate and the drain contact.

12 Claims, 11 Drawing Sheets

(56) References Cited

U.S. PATENT DOCUMENTS

| | | |
|---|---|---|
| 2015/0249017 A1 | 9/2015 | Raley et al. |
| 2016/0190244 A1 | 6/2016 | Lee et al. |
| 2017/0077235 A1 | 3/2017 | Caudillo et al. |
| 2018/0342585 A1 | 11/2018 | Lu et al. |

OTHER PUBLICATIONS

International Search Report and Written Opinion—PCT/US2018/033396—ISA/EPO—dated Aug. 14, 2018.
Robinson J.T., et al., "Properties of Fluorinated Graphene Films", American Chemical Society, vol. 10, No. 8, 2010, pp. 3001-3005.

TRANSISTOR WITH FLUORINATED GRAPHENE SPACER

CROSS-REFERENCE TO RELATED APPLICATION

The present application is a divisional of U.S. patent application Ser. No. 15/672,017, filed on Aug. 8, 2017, and titled "TRANSISTOR WITH FLUORINATED GRAPHENE SPACER," and claims the benefit of U.S. Provisional Patent Application No. 62/510,487, filed on May 24, 2017, and titled "TRANSISTOR WITH FLUORINATED GRAPHENE SPACER," the disclosures of which are expressly incorporated by reference herein in their entireties.

BACKGROUND

Field

Aspects of the present disclosure relate to semiconductor devices, and more particularly to gate spacers.

Background

As integrated circuit (IC) technology advances, device geometries are reduced. Reducing the geometry and "pitch" (spacing) between devices may cause devices to interfere with each other and affect proper operation.

Fin-based devices are three-dimensional structures on the surface of a semiconductor substrate. A fin-based transistor, which may be a fin-based metal-oxide-semiconductor field-effect transistor (MOSFET), may be referred to as a FinFET. A nanowire field-effect transistor (FET) is also a three-dimensional structure on the surface of a semiconductor substrate. A nanowire FET includes doped portions of the nanowire that contact a channel region and serve as the source and drain regions of the device. A nanowire FET is also an example of a MOSFET device.

The performance of MOSFET devices can be affected by numerous factors including channel length, strain, and external resistance. Additionally, contact parasitic capacitance of source/drain contacts can significantly affect logic and radio frequency (RF) circuit performance.

SUMMARY

An integrated circuit (IC) device may include a semiconductor structure. The semiconductor structure may include a source contact, a drain contact, and a gate. A first fluorocarbon spacer may be between the gate and the source contact. A second fluorocarbon spacer may be between the gate and the drain contact.

A method of fabricating an integrated circuit (IC) device may include growing a first fluorocarbon spacer between a gate and a source contact. The method may further include growing a second fluorocarbon spacer between the gate and a drain contact. The method may also include growing low-K spacers between the first fluorocarbon spacer and the source contact, and between the second fluorocarbon spacer and the drain contact.

An integrated circuit (IC) device may include a semiconductor structure. The semiconductor structure may include a source contact, a drain contact, and a gate. A means for spacing may be between the gate and the source contact, and between the gate and the drain contact.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
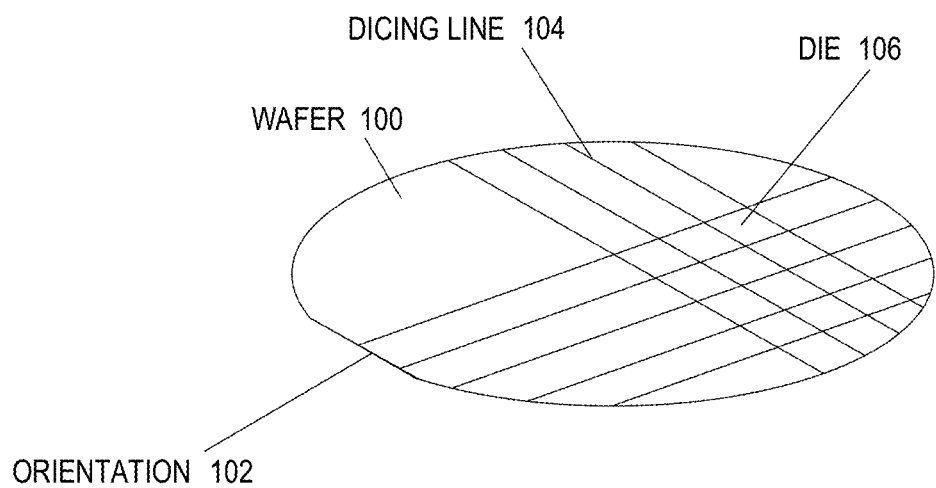
FIG. 1 illustrates a perspective view of a semiconductor wafer.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Complementary metal-oxide-semiconductor (CMOS) fabrication processes are often divided into three parts: a front-end-of-line (FEOL), a middle-of-line (MOL), and a back-end-of-line (BEOL). Front-end-of-line processes include wafer preparation, isolation, well formation, gate patterning, spacers, and dopant implantation. A middle-of-line process includes gate and terminal contact formation. Back-end-of-line processes include forming interconnects and dielectric layers for coupling to the FEOL devices. The gate and terminal contact formation of the middle-of-line (MOL) process, however, is an increasingly challenging part of the fabrication flow as a result of increased contact parasitic capacitance at the MOL trench interconnect layer.

Fin-based devices represent a significant advance in integrated circuit (IC) technology over planar-based devices. Fin-based devices are three-dimensional (3D) structures on the surface of a semiconductor substrate. A FinFET transistor is a fin-based metal-oxide-semiconductor field-effect transistor (MOSFET). Unfortunately, contact parasitic capacitance (Cpc) of source/drain trench (CA) contacts at the MOL layers (e.g., Cpc-CA) may be high in fin-based devices. In FinFET devices, a spacer material is provided between a gate stack (e.g., gate metal) and the source/drain trench (CA) contacts.

As technology scaling continues, associated shrinking of a gate pitch reduces the spacer area between the source/drain trench (CA) contacts and the gate stack. This causes a dramatic increase in the contact parasitic capacitance (Cpc) of the CA contacts (Cpc-CA). This significantly affects logic and RF circuit performance. Given that a transistor to contact spacer size will shrink with each technology generation, reducing the CA contact parasitic capacitance Cpc-CA may be achieved by reducing a K (dielectric constant) value of the spacer material. Currently a low-K material (e.g., silicon boron carbon nitride (SiBCN)) used as the spacer material has a K value around 5 or above.

Aspects of the present disclosure may use fluorinated graphene (fluorographene) to at least partially or entirely replace a low-K (e.g., silicon boron carbon nitride or SiBCN) spacer material. This may reduce an effective spacer K value to 1.6. An effective spacer K value (e.g., <5) may reduce the CA contact parasitic capacitance Cpc-CA by a substantial amount (e.g., ~70% for a K value of 1.6). Graphene has high resistivity with a low K value once fluorinated, which makes fluorographene a compelling candidate for replacing conventional low-K spacer material. A low-K spacer material, however, may be deposited outside the fluorinated graphene as a partial spacer material to maintain etch selectivity for further source and drain formation. This avoids any negative impact on the device fabrication process when using fluorographene.

Various aspects of the disclosure provide techniques for reducing a CA contact parasitic capacitance (Cpc-CA) of a transistor. It will be understood that the term "layer" includes film and is not to be construed as indicating a vertical or horizontal thickness unless otherwise stated. As described herein, the term "substrate" may refer to a substrate of a diced wafer or may refer to the substrate of a wafer that is not diced. Similarly, the terms wafer and die may be used interchangeably.

Aspects of the present disclosure include an innovative fluorinated graphene spacer that reduces a contact parasitic capacitance (Cpc-CA) of a transistor. The innovative fluorinated graphene spacer may at least partially or entirely replace conventional low-K spacer materials. For example, the fluorinated graphene spacer may be on a sidewall of a gate, between the gate and a source/drain. According to an aspect of the present disclosure, the fluorinated graphene spacer may be at least 0.3 nanometers (nm) in width. In this arrangement, a low-K spacer material (e.g., SiBCN) may be deposited on a sidewall of the fluorinated graphene spacer, between the fluorinated graphene spacer and the source/drain contact. The fluorinated spacer includes advantages such as a substantial (e.g., 70%) reduction in contact parasitic capacitance as well as improved device performance (e.g., speed >10%).

According to aspects of the present disclosure, the fluorinated graphene spacer may be fabricated using chemical vapor deposition (CVD) on a sacrificial catalyst layer. A low resistivity carbon alloy may be diffused and subsequently fluorinated. Alternatively, the fluorinated graphene spacer may be fabricated by decomposition of atmospheric pressure CVD (APCVD) carbonaceous precursors, and fluorinating a low resistivity carbon alloy. Other processes may also be utilized to fabricate the fluorinated graphene spacer.

According to additional aspects of the present disclosure, the transistor may be a planar transistor structure or a gate all around (GAA) transistor.

FIG. 1 illustrates a perspective view of a semiconductor wafer. A wafer 100 may be a semiconductor wafer, or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystalizes onto the seed crystal in the orientation of the crystal. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants, and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, different types of electronic devices may be formed in or on the wafer 100.

The wafer 100 has an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100.

The Miller Indices form a notation system of the crystallographic planes in crystal lattices. The lattice planes may be indicated by three integers h, k, and f, which are the Miller indices for a plane (hkl) in the crystal. Each index denotes a plane orthogonal to a direction (h, k, l) in the basis of the reciprocal lattice vectors. The integers are usually written in lowest terms (e.g., their greatest common divisor should be 1). Miller index 100 represents a plane orthogonal to direction h; index 010 represents a plane orthogonal to direction k, and index 001 represents a plane orthogonal to l. For some crystals, negative numbers are used (written as a bar over the index number) and for some crystals, such as gallium nitride, more than three numbers may be employed to adequately describe the different crystallographic planes.

Once the wafer 100 has been processed as desired, the wafer 100 is divided up along dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package.

Figure 2:
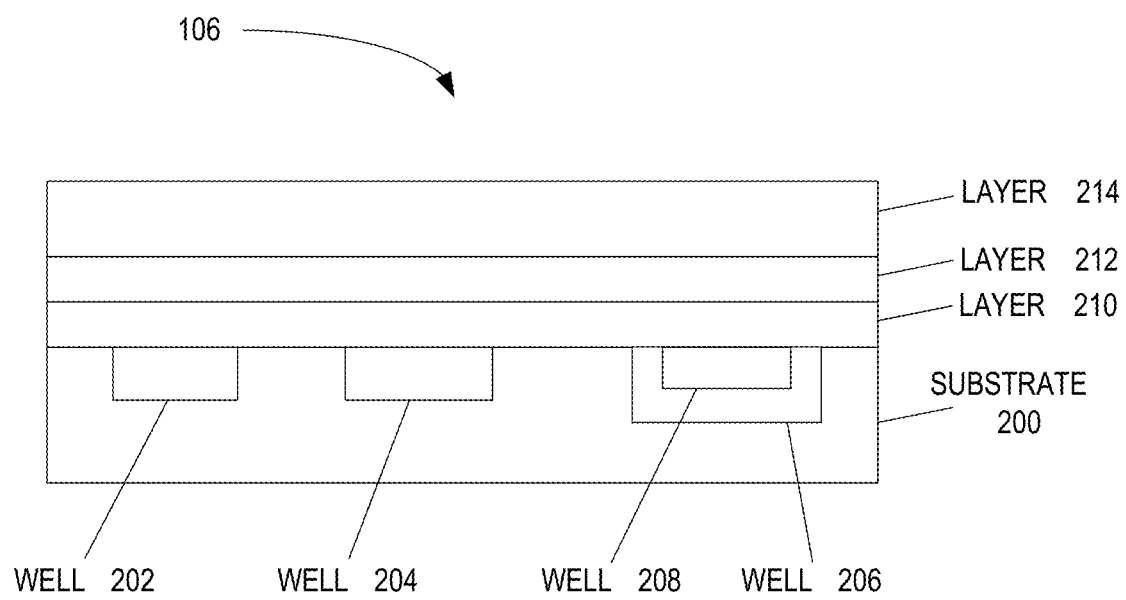
FIG. 2 illustrates a cross-sectional view of a die.

FIG. 2 illustrates a cross-sectional view of a die 106. In the die 106, there may be a substrate 200, which may be a semiconductor material and/or may act as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200.

Within a substrate 200 (e.g., a semiconductor substrate), there may be wells 202 and 204 of a field-effect transistor (FET), or wells 202 and/or 204 may be fin structures of a fin structured FET (FinFET). Wells 202 and/or 204 may also be other devices (e.g., a resistor, a capacitor, a diode, or other electronic devices) depending on the structure and other characteristics of the wells 202 and/or 204 and the surrounding structure of the substrate 200.

The semiconductor substrate may also have a well 206 and a well 208. The well 208 may be completely within the well 206, and, in some cases, may form a bipolar junction transistor (BJT). The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure.

Figure 3:
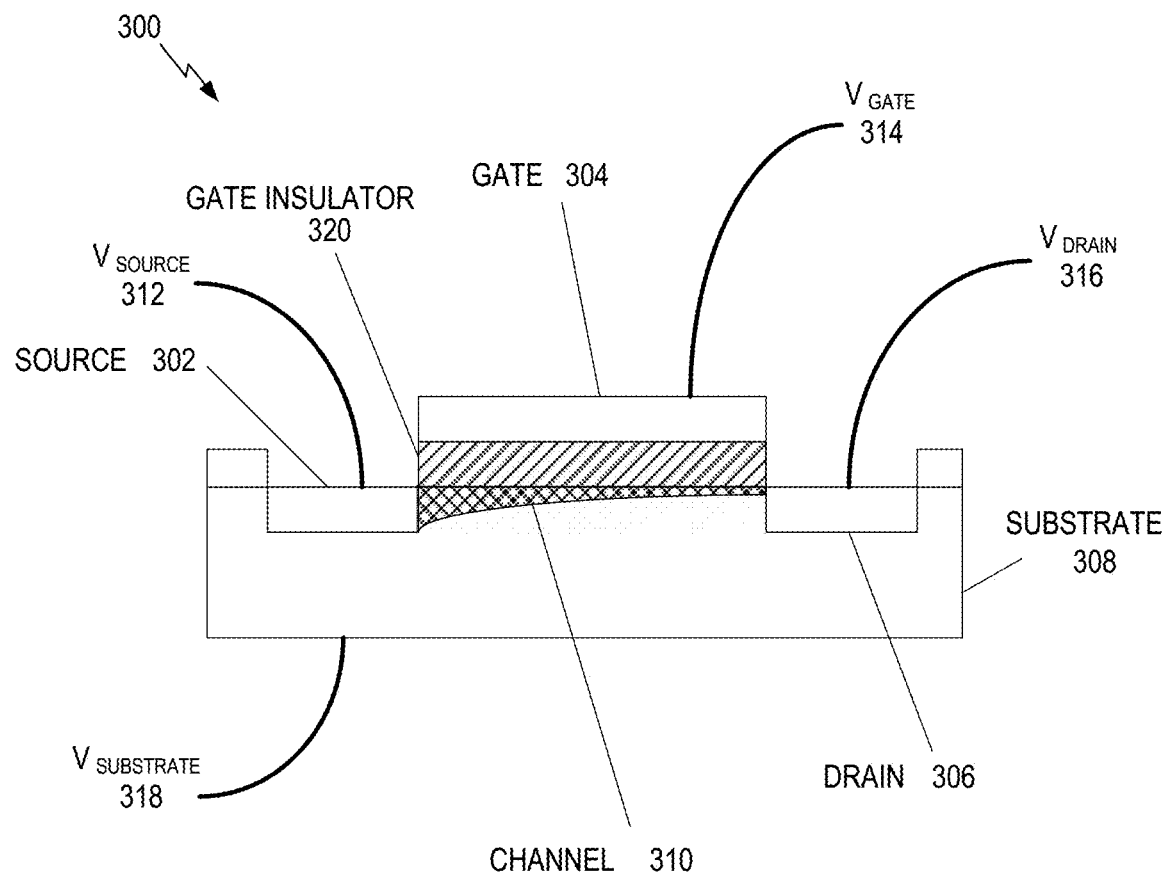
FIG. 3 illustrates a cross-sectional view of a metal-oxide-semiconductor field-effect transistor (MOSFET) device.
Figure 3:
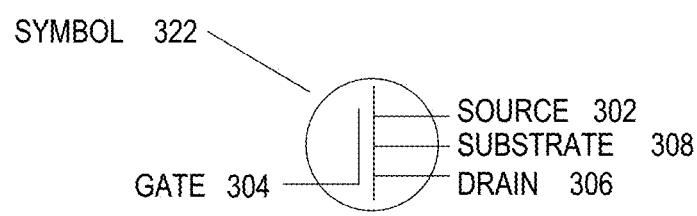

FIG. 3 illustrates a cross-sectional view of a metal-oxide-semiconductor field-effect transistor (MOSFET) device 300. The MOSFET device 300 may have four input terminals. The four inputs are a source 302, a gate 304, a drain 306, and a body. The source 302 and the drain 306 may be fabricated as the wells 202 and 204 in a substrate 308, or may be fabricated as areas above the substrate 308, or as part of other layers on the die 106. Such other structures may be a fin or other structure that protrudes from a surface of the substrate 308. Further, the substrate 308 may be the substrate 200 on the die 106, but the substrate 308 may also be one or more of the layers (e.g., 210-214) that are coupled to the substrate 200.

The MOSFET device 300 is a unipolar device, as electrical current is produced by only one type of charge carrier (e.g., either electrons or holes) depending on the type of MOSFET. The MOSFET device 300 operates by controlling the amount of charge carriers in the channel 310 between the source 302 and the drain 306. A voltage Vsource 312 is applied to the source 302, a voltage Vgate 314 is applied to the gate 304, and a voltage Vdrain 316 is applied to the drain 306. A separate voltage Vsubstrate 318 may also be applied to the substrate 308, although the voltage Vsubstrate 318 may be coupled to one of the voltage Vsource 312, the voltage Vgate 314 or the voltage Vdrain 316.

To control the charge carriers in the channel 310, the voltage Vgate 314 creates an electric field in the channel 310 when the gate 304 accumulates charges. The opposite charge to that accumulating on the gate 304 begins to accumulate in the channel 310. The gate insulator 320 insulates the charges accumulating on the gate 304 from the source 302, the drain 306, and the channel 310. The gate 304 and the channel 310, with the gate insulator 320 in between, create a capacitor, and as the voltage Vgate 314 increases, the charge carriers on the gate 304, acting as one plate of this capacitor, begin to accumulate. This accumulation of charges on the gate 304 attracts the opposite charge carriers into the channel 310. Eventually, enough charge carriers are accumulated in the channel 310 to provide an electrically conductive path between the source 302 and the drain 306. This condition may be referred to as opening the channel of the FET.

By changing the voltage Vsource 312 and the voltage Vdrain 316, and their relationship to the voltage Vgate 314, the amount of voltage applied to the gate 304 that opens the channel 310 may vary. For example, the voltage Vsource 312 is usually of a higher potential than that of the voltage Vdrain 316. Making the voltage differential between the voltage Vsource 312 and the voltage Vdrain 316 larger will change the amount of the voltage Vgate 314 used to open the channel 310. Further, a larger voltage differential will change the amount of electromotive force moving charge carriers through the channel 310, creating a larger current through the channel 310.

The gate insulator 320 material may be silicon oxide, or may be a dielectric or other material with a different dielectric constant (k) than silicon oxide. Further, the gate insulator 320 may be a combination of materials or different layers of materials. For example, the gate insulator 320 may be Aluminum Oxide, Hafnium Oxide, Hafnium Oxide Nitride, Zirconium Oxide, or laminates and/or alloys of these materials. Other materials for the gate insulator 320 may be used without departing from the scope of the present disclosure.

By changing the material for the gate insulator 320, and the thickness of the gate insulator 320 (e.g., the distance between the gate 304 and the channel 310), the amount of charge on the gate 304 to open the channel 310 may vary. A symbol 322 showing the terminals of the MOSFET device 300 is also illustrated. For N-channel MOSFETs (using electrons as charge carriers in the channel 310), an arrow is applied to the substrate 308 terminal in the symbol 322 pointing away from the gate 304 terminal. For p-type MOSFETs (using holes as charge carriers in the channel 310), an arrow is applied to the substrate 308 terminal in the symbol 322 pointing toward the gate 304 terminal.

The gate 304 may also be made of different materials. In some designs, the gate 304 is made from polycrystalline silicon, also referred to as polysilicon or poly, which is a conductive form of silicon. Although referred to as "poly" or "polysilicon" herein, metals, alloys, or other electrically conductive materials are contemplated as appropriate materials for the gate 304 as described in the present disclosure.

In some MOSFET designs, a high-k value material may be desired in the gate insulator 320, and in such designs, other conductive materials may be employed. For example, and not by way of limitation, a "high-k metal gate" design may employ a metal, such as copper, for the gate 304 terminal. Although referred to as "metal," polycrystalline materials, alloys, or other electrically conductive materials are contemplated as appropriate materials for the gate 304 as described in the present disclosure.

To interconnect to the MOSFET device 300, or to interconnect to other devices in the die 106 (e.g., semiconductor), interconnect traces or layers are used. These interconnect traces may be in one or more of layers (e.g., 210-214), or may be in other layers of the die 106.

Figure 4:
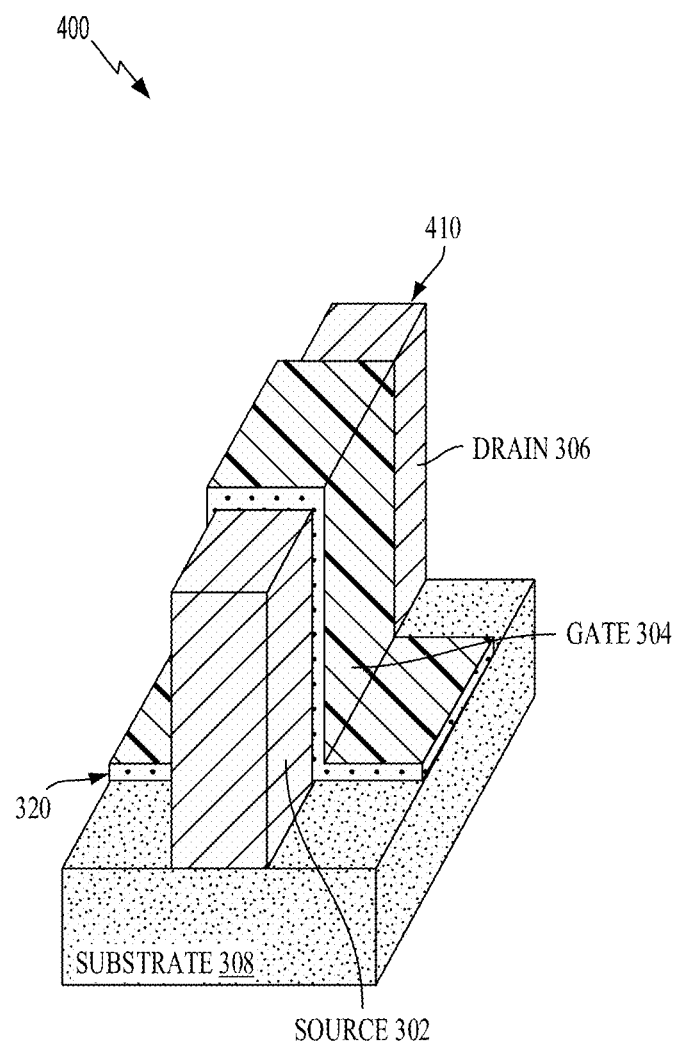
FIG. 4 illustrates a fin field-effect transistor (FinFET).

FIG. 4 illustrates a fin-structured FET (FinFET 400) that operates in a similar fashion to the MOSFET device 300 described with respect to FIG. 3. According to aspects of the present disclosure, the FinFET 400 may include fluorinated spacers. A fin 410 in a FinFET 400, however, is grown or otherwise coupled to the substrate 308. The substrate 308 may be a semiconductor substrate or other like supporting layer, for example, comprised of an oxide layer, a nitride layer, a metal oxide layer or a silicon layer. The fin 410 includes the source 302 and the drain 306. A gate 304 is disposed on the fin 410 and on the substrate 308 through a gate insulator 320. A FinFET transistor is a 3D fin-based metal-oxide-semiconductor field-effect transistor (MOSFET). As a result, the physical size of the FinFET 400 may be smaller than the MOSFET device 300 structure shown in FIG. 3. This reduction in physical size allows for more devices per unit area on the die 106.

Although the FinFET 400 may represent a significant advance in integrated circuit (IC) technology over planar-based devices, contact parasitic capacitance is a problem for FinFET transistors. In particular, the contact parasitic capacitance (Cpc) of the source/drain trench (CA) contacts at the middle-of-line layer (e.g., Cpc-CA) may be high in fin-based devices, for example, as shown in FIG. 5.

Figure 5:
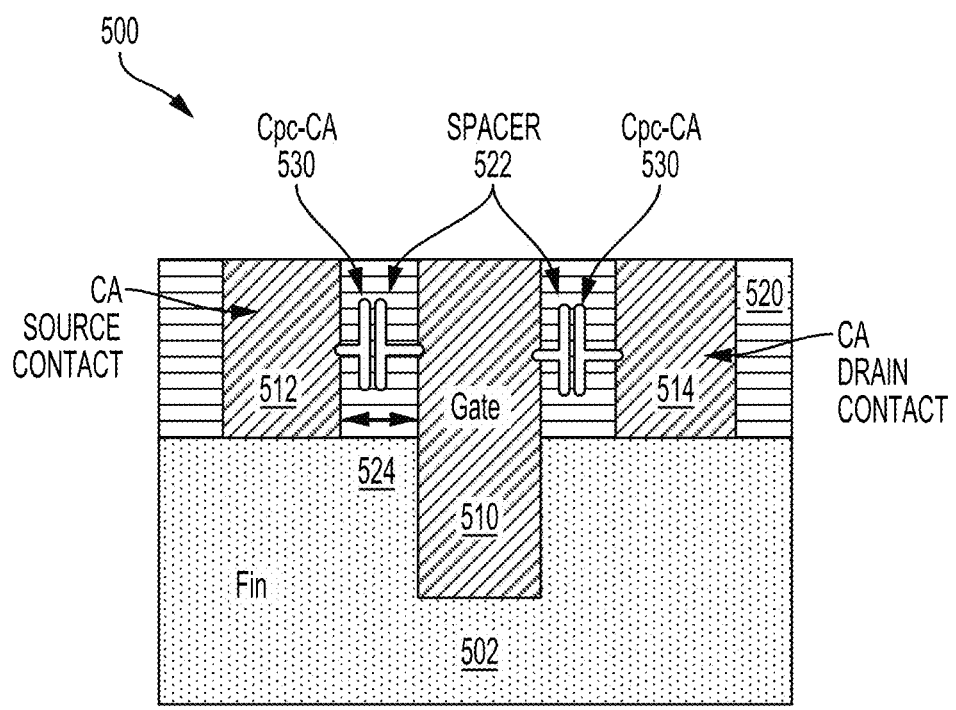
FIG. 5 illustrates a conventional integrated circuit (IC) device.

FIG. 5 illustrates a conventional integrated circuit (IC) device 500. The IC device 500 includes a gate 510 between a source contact 512 and a drain contact 514, as well as a low-K dielectric layer 520, which are all in electrical contact with a substrate 502. A spacer material 522 (e.g., the low-K dielectric layer 520) is between the gate 510 and each of the source contact 512 and the drain contact 514. In operation, the IC device 500 may suffer from contact parasitic capacitance (Cpc) between the source/drain trench (CA) contacts and the gate 510 (e.g., Cpc-CA 530). For example, the Cpc-CA 530 occurs in the spacer material 522 between the gate 510 and the source contact 512, and between the gate 510 and the drain contact 514.

Unfortunately, as technology scaling continues to shrink, a space 524 (e.g., 9 nanometers (nm)) between the gate 510 and each of the source contact 512 and drain contact 514 is also reduced. This causes a dramatic increase in the Cpc-CA 530, which significantly affects performance of the IC device 500. Given that the space 524 (e.g., a transistor to contact spacer size) is shrinking with each technology generation, reducing the CA contact parasitic capacitance Cpc-CA 530 may be achieved by reducing a K (dielectric constant) value of the spacer material 522.

Aspects of the present disclosure include an innovative fluorinated graphene spacer that reduces a CA contact parasitic capacitance Cpc-CA of a transistor. The innovative fluorinated graphene spacer may at least partially or entirely replace the low-K spacer material used in conventional fin-based devices. For example, the fluorinated graphene spacer may be on a sidewall of a gate, between the gate and a source/drain region. According to an aspect of the present disclosure, the fluorinated graphene spacer may be at least 0.3 nanometers thick. In addition, a low-K spacer material (e.g., SiBCN) may be deposited on a sidewall of the fluorinated graphene spacer, between the fluorinated graphene spacer and the source/drain region.

According to additional aspects of the present disclosure, the complementary metal-oxide-semiconductor (CMOS) transistor may be a planar transistor structure or a gate all around (GAA) transistor.

By replacing a conventional gate spacer with the fluorinated graphene spacer, a contact parasitic capacitance is significantly reduced because the K value of fluorographene is four times lower than that of the conventional gate spacer (e.g., SiBCN). As such, device and chip performance are substantially improved. For example, by partially replacing the conventional spacer material with the fluorinated graphene spacer, the CA contact parasitic capacitance is reduced due to the series combination of the different spacer material K values.

Figure 6:
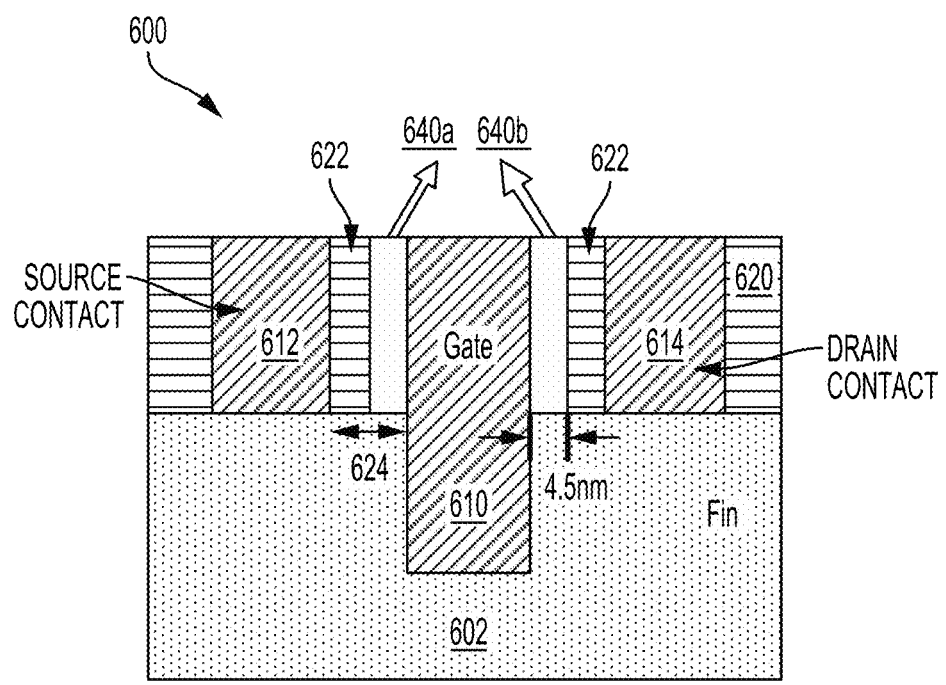
FIG. 6 illustrates an integrated circuit (IC) device including fluorinated spacers according to aspects of the present disclosure.

FIG. 6 illustrates an integrated circuit (IC) device 600 including fluorinated spacers according to aspects of the present disclosure. The IC device 600 (e.g., a transistor) may include a gate 610 in between a source contact 612 and a drain contact 614, as well as a low-K dielectric layer 620, which are all in electrical contact with a semiconductor structure 602. According to an aspect of the present disclosure, a distance 624 between the gate 610 and the source contact 612, and the gate 610 and the drain contact 614 is less than 9 nanometers. The semiconductor structure 602 may be a fin transistor structure (e.g., a FinFET), a planar transistor structure, or a gate all around (GAA) transistor structure.

According to aspects of the present disclosure, a first spacer 640a (e.g., a first fluorocarbon spacer) may be disposed between the gate 610 and the source contact 612. A second spacer 640b (e.g., a second fluorocarbon spacer) may be disposed between the gate 610 and the drain contact 614. The first spacer 640a and the second spacer 640b may each have a thickness of at least 0.3 nanometers. Alternatively, the thickness may be less than 4.5 nanometers. These values are exemplary, however, and other values are possible. The first spacer 640a and the second spacer 640b may each contact opposite sidewalls of the gate 610. According to an aspect of the present disclosure, the first spacer 640a and the second spacer 640b may be fluorographene spacers. The first spacer 640a and the second spacer 640b may also be two-dimensional (2D) spacers.

According to additional aspects of the present disclosure, a spacer material 622 (e.g., the low-K dielectric layer 620) is between the gate 610, the source contact 612, and the drain contact 614. In this example, the spacer material 622 is between the first spacer 640a and the source contact 612, and between the second spacer 640b and the drain contact 614. The spacer material 622 may be silicon boron carbon nitride (e.g., SiBCxNx), silicon nitride (SiN), or other like low-K dielectric material. Although the spacer material 622 is shown as the same material as the low-K dielectric layer 620, the spacer material 622 and the low-K dielectric layer 620 may be different materials. For example, the spacer material 622 may include, but is not limited to, SixOx (silicon oxide) and SixOxCxNx (silicon oxide carbon nitride).

Figure 7A:
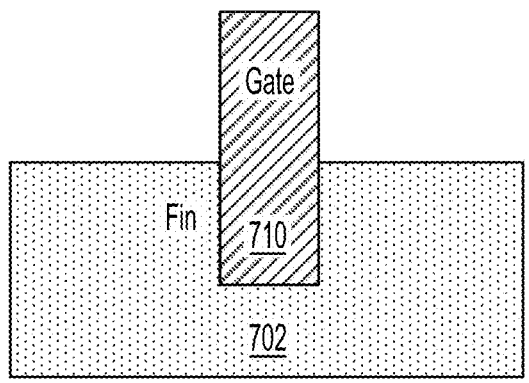
FIGS. 7A-7C illustrate a fabrication process for an integrated circuit (IC) device including fluorinated spacers according to aspects of the present disclosure.
Figure 7B:
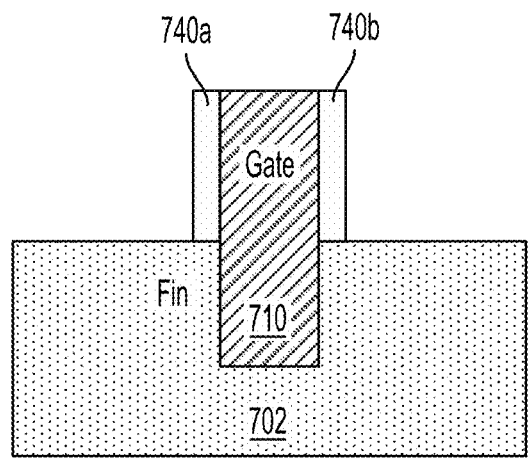
Figure 7C:
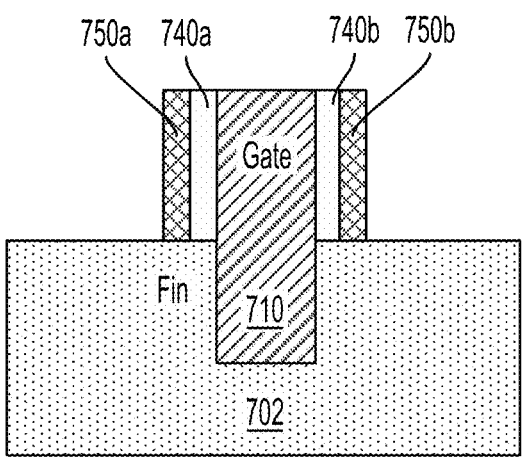

FIGS. 7A-7C illustrate a fabrication process for an integrated circuit (IC) device including fluorinated spacers according to aspects of the present disclosure. As illustrated in FIGS. 7A-7C, replacing the conventional gate spacer with fluorinated graphene spacers significantly reduces the contact parasitic capacitance in the transistor because the K value of fluorographene is four times lower than that of the conventional gate spacer. This results in substantial improvement to device and chip performance.

FIG. 7A illustrates a gate 710 formed on a semiconductor structure 702. The semiconductor structure 702 may be a fin transistor structure (e.g., a FinFET), a planar transistor structure, or a gate all around (GAA) transistor structure. According to an aspect, the gate 710 may be a dummy gate or a real gate.

FIG. 7B illustrates a first spacer 740a (e.g., a first fluorocarbon spacer) and a second spacer 740b (e.g., a second fluorocarbon spacer) formed on opposite sidewalls of the gate 710.

According to an aspect of the present disclosure, the first spacer 740a and the second spacer 740b may be fabricated using chemical vapor deposition (CVD) on a sacrificial catalyst layer (e.g., Ti). For example, the sacrificial catalyst layer is first deposited on the gate 710. A low resistivity carbon alloy (e.g., graphene) is deposited by CVD CH4 diffusion through a Ti grain boundary of the sacrificial catalyst layer to an interface of Ti/TiN. A Ti layer of the sacrificial catalyst layer is removed, and the low resistivity carbon alloy may be fluorinated.

Alternatively, the low resistivity carbon alloy (e.g., graphene) may be fabricated by decomposing carbonaceous precursors using atmospheric pressure CVD (APCVD). For example, a thin catalyst layer (e.g., 1 to 2 nanometers (nm) of tungsten (W) atomic layer deposition (ALD)) is deposited on the sidewalls of the gate 710, and carbonaceous precursors are decomposed by APCVD to deposit a layer of the low resistivity carbon alloy. The low resistivity carbon alloy may then be fluorinated.

These processes described are exemplary, however, and other processes may also be used to fabricate the low resistivity carbon alloy.

According to aspects of the present disclosure, the first spacer 740a and the second spacer 740b may each have a thickness of at least 0.3 nanometers, or may be less than 4.5 nanometers. These values are exemplary, however, and other values are possible. Additionally, the first spacer 740a and the second spacer 740b may be fluorographene spacers and may be two-dimensional (2D).

FIG. 7C illustrates a first dielectric spacer 750a formed on the first spacer 740a, and a second dielectric spacer 750b formed on the second spacer 740b. The first dielectric spacer 750a and the second dielectric spacer 750b may be a low-K spacer material such as silicon boron carbon nitride (e.g., SiBCxNx), silicon nitride (SiN), or other like low-K dielectric material.

According to aspects of the present disclosure, a source contact and a drain contact may be fabricated after deposition of the spacer layers. A dielectric, such as a low-K spacer material, may also be deposited to complete the IC device.

Figure 8:
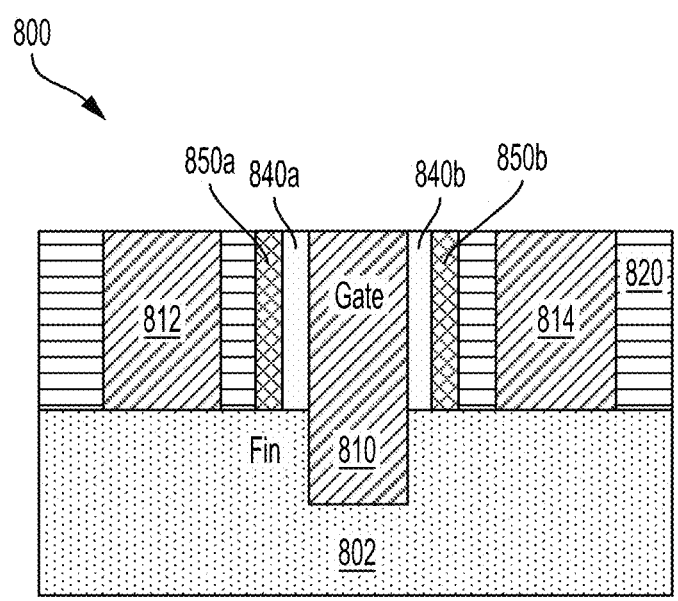
FIG. 8 illustrates an integrated circuit (IC) device including fluorinated spacers according to aspects of the present disclosure.

FIG. 8 illustrates an integrated circuit (IC) device 800 including fluorinated spacers according to aspects of the present disclosure. Similar to the above-described IC device 600 in FIG. 6, the IC device 800 includes a gate 810 between a source contact 812 and a drain contact 814, which are all electrically coupled to a semiconductor structure 802. A first spacer 840a is between the gate 810 and the source contact 812, and a second spacer 840b is between the gate 810 and the drain contact 814.

Additionally, a first dielectric spacer 850a may be between the first spacer 840a and the source contact 812. A second dielectric spacer 850b may be between the second spacer 840b and the drain contact 814. The first dielectric spacer 850a and the second dielectric spacer 850b may be a low-K spacer material such as silicon boron carbon nitride (e.g., SiBCxNx), silicon nitride (SiN), or other like low-K dielectric material.

According to additional aspects of the present disclosure, a dielectric 820 may surround the gate 810, the source contact 812, and the drain contact 814. Portions of the dielectric 820 may also be between the first dielectric spacer 850a and the source contact 812, and between the second dielectric spacer 850b and the drain contact 814. According to an aspect, the dielectric 820 may be a low-K spacer material. The dielectric 820 may be a different material than the first dielectric spacer 850a and the second dielectric spacer 850b. For example, the dielectric 820 may be SiBCxNx, and the first dielectric spacer 850a and the second dielectric spacer 850b may be SiN. Additionally, the first dielectric spacer 850a and the second dielectric spacer 850b may be the same or different materials, which may both be different from the dielectric 820. For example, the dielectric 820 may be SiBCxNx, the first dielectric spacer 850a may be SiN, and the second dielectric spacer 850b may be SiCxNx. These are exemplary only, and other combinations are possible.

Figure 9:
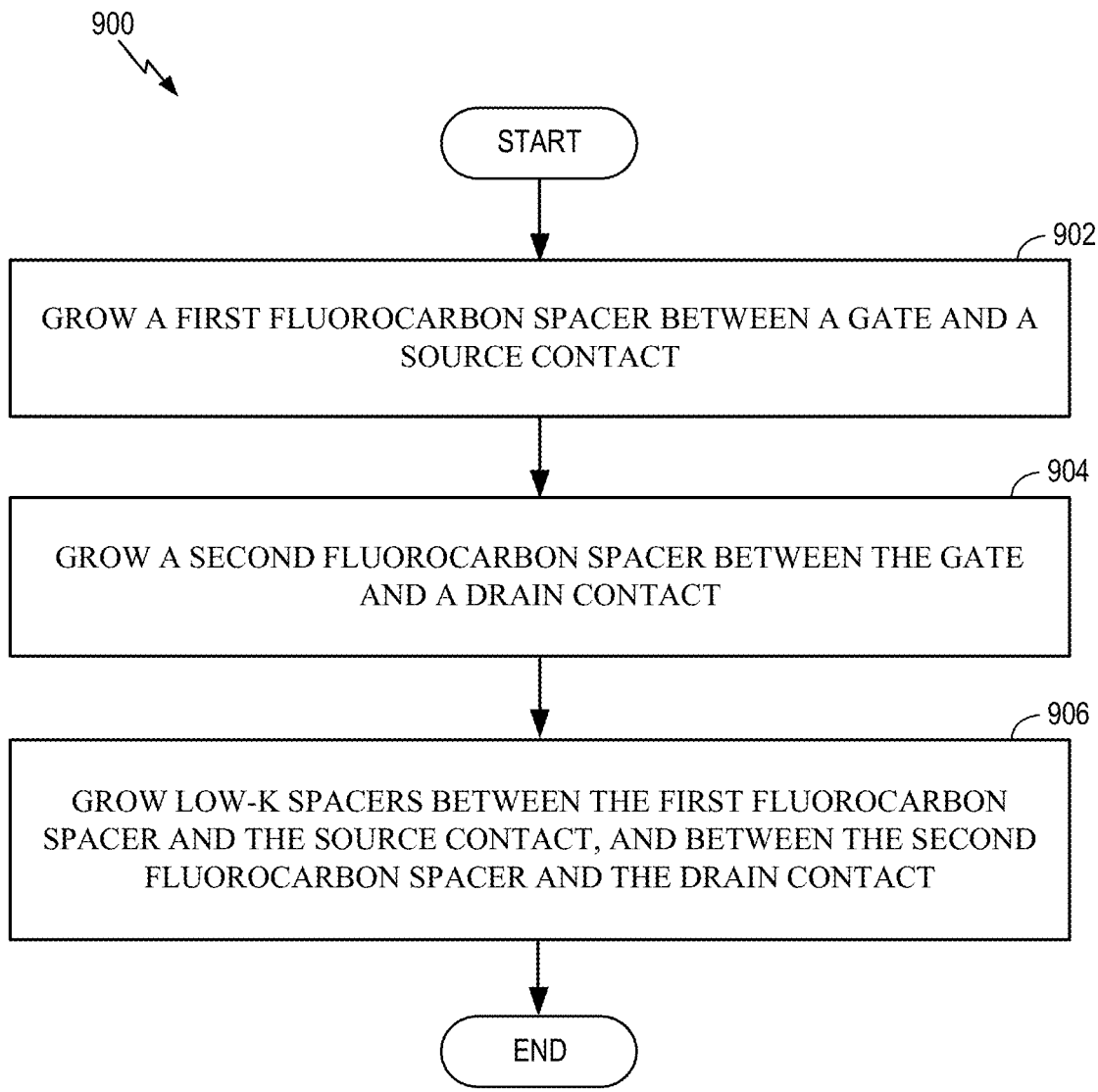
FIG. 9 illustrates a method for fabricating an integrated circuit (IC) device including fluorinated spacers according to aspects of the present disclosure.

FIG. 9 is a process flow diagram illustrating a method 900 of fabricating an integrated circuit (IC) device including fluorinated spacers, according to aspects of the present disclosure. The method 900 may begin with a semiconductor structure 702, including a gate 710 wrapped around the semiconductor structure 702 (e.g., a fin), a source contact 712 and a drain contact 714 on the semiconductor structure 702, for example, as shown in FIG. 7A.

At block 902, a first fluorocarbon spacer is grown between a gate and a source contact. For example, as shown in FIG. 7B, the first spacer 740a is grown on the sidewall of the gate 710, between the gate 710 and the source contact 712. At block 904, a second fluorocarbon spacer is grown between the gate and a drain contact. For example, as shown in FIG. 7B, the second spacer 740b is grown on the opposite sidewall of the gate 710, between the gate 710 and the drain contact 714.

According to an aspect of the present disclosure, the first spacer 740a and the second spacer 740b may be fabricated using chemical vapor deposition (CVD) on a sacrificial catalyst layer (e.g., Ti). For example, the sacrificial catalyst layer is first deposited on the gate 710. A low resistivity carbon alloy (e.g., graphene) is deposited by CVD $CH_4$ diffusion through a Ti grain boundary of the sacrificial catalyst layer to an interface of Ti/TiN. A top Ti layer of the sacrificial catalyst layer is removed, and the low resistivity carbon alloy may be fluorinated.

Alternatively, the low resistivity carbon alloy (e.g., graphene) may be fabricated by decomposition of atmospheric pressure CVD (APCVD) carbonaceous precursors. For example, a thin catalyst layer (e.g., 1 to 2 nm of tungsten (W) atomic layer deposition (ALD)) is deposited on the sidewalls of the gate 710, and carbonaceous precursors are decomposed by APCVD to deposit a layer of the low resistivity carbon alloy. The low resistivity carbon alloy may then be fluorinated.

These processes described are exemplary, however, and other processes may also be used to fabricate the low resistivity carbon alloy.

At block 906, low-K spacers are grown between the first fluorocarbon spacer and the source contact, and between the second fluorocarbon spacer and the drain contact. For example, as shown in FIG. 8, the first dielectric spacer 850a and the second dielectric spacer 850b are grown between the first spacer 840a and the second spacer 840b, and between the source contact 812 and the drain contact 814, respectively.

By replacing a conventional gate spacer with the fluorinated graphene spacer, a contact parasitic capacitance is significantly reduced because the K value of fluorographene is four times lower than that of the conventional gate spacer (e.g., SiBCN). As such, device and chip performance are substantially improved. For example, by partially replacing the conventional spacer material with the fluorinated graphene spacer, the CA contact parasitic capacitance is reduced due to the series combination of the different spacer material K values.

According to an aspect of the present disclosure, an integrated circuit (IC) device is described. In one configuration, the IC device includes means for spacing. The spacing means may be fluorinated spacers. In another aspect, the aforementioned means may be any module or any apparatus or material configured to perform the functions recited by the aforementioned means.

Figure 10:
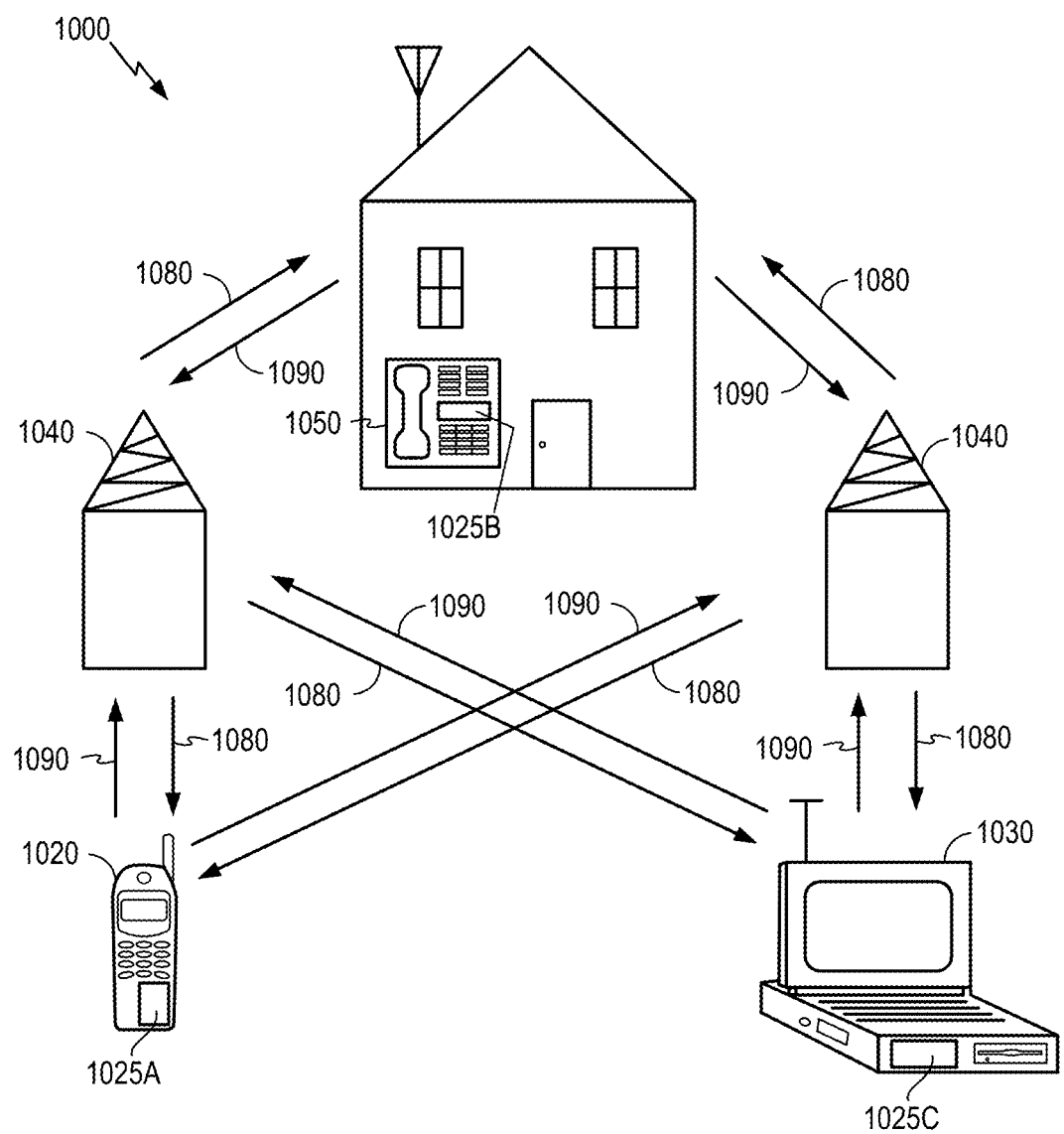
FIG. 10 is a block diagram showing an exemplary wireless communication system in which an aspect of the disclosure may be advantageously employed.

FIG. 10 is a block diagram showing an exemplary wireless communication system 1000 in which an aspect of the disclosure may be advantageously employed. For purposes of illustration, FIG. 10 shows three remote units 1020, 1030, and 1050 and two base stations 1040. It will be recognized that wireless communication systems may have many more remote units and base stations. Remote units 1020, 1030, and 1050 include IC devices 1025A, 1025C, and 1025B that include the disclosed IC device. It will be recognized that other devices may also include the disclosed IC device, such as the base stations, switching devices, and network equipment. FIG. 10 shows forward link signals 1080 from the base station 1040 to the remote units 1020, 1030, and 1050 and reverse link signals 1090 from the remote units 1020, 1030, and 1050 to base station 1040.

In FIG. 10, remote unit 1020 is shown as a mobile telephone, remote unit 1030 is shown as a portable computer, and remote unit 1050 is shown as a fixed location remote unit in a wireless local loop system. For example, the remote units may be a mobile phone, a hand-held personal communication systems (PCS) unit, a portable data unit such as a personal data assistant, a GPS enabled devices, a navigation device, a set top box, a music player, a video player, an entertainment unit, a fixed location data unit such as meter reading equipment, or other devices that store or retrieve data or computer instructions, or combinations thereof. Although FIG. 10 illustrates remote units according to the aspects of the disclosure, the disclosure is not limited to these exemplary illustrated units. Aspects of the disclosure may be suitably employed in many devices, which include the disclosed IC device.

Figure 11:
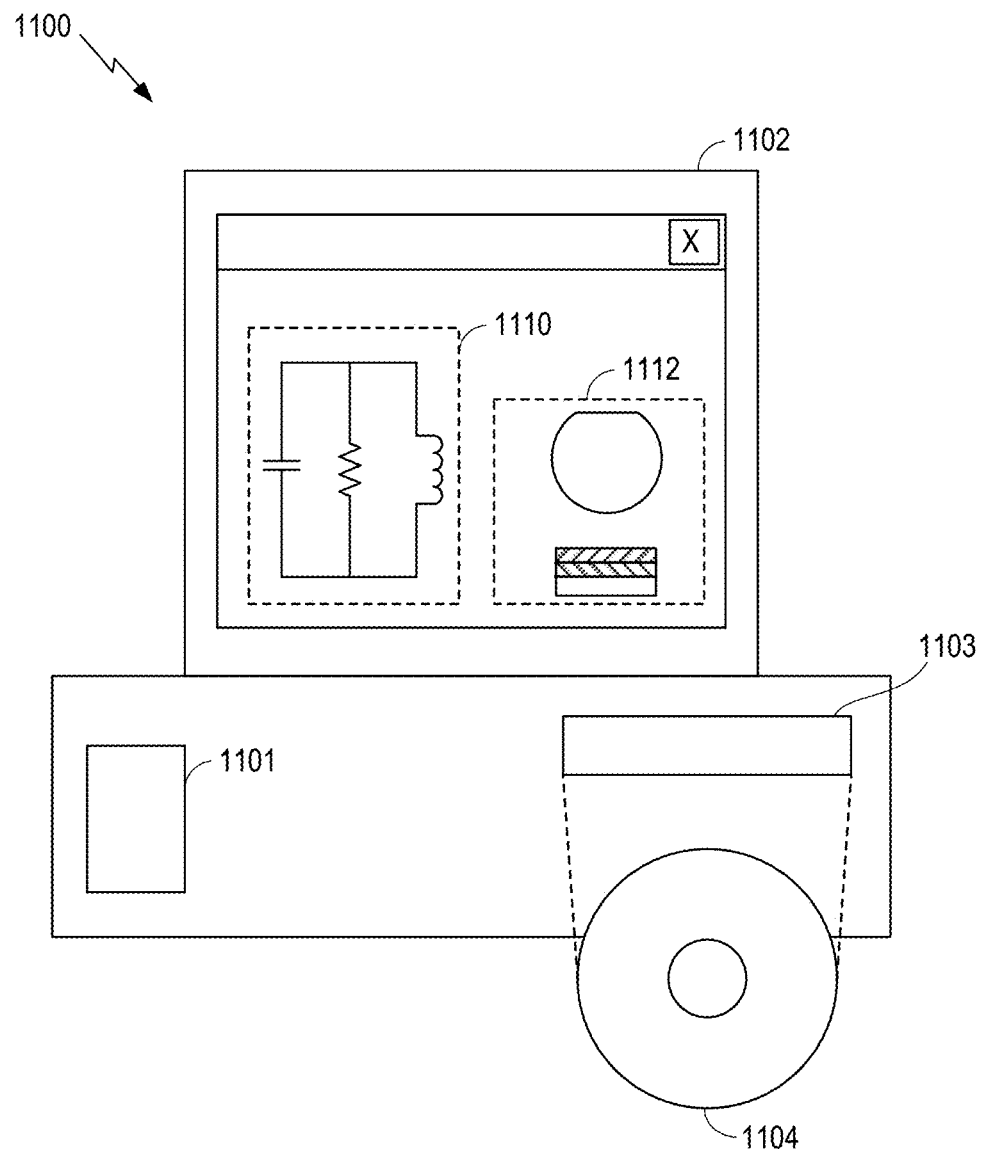
FIG. 11 is a block diagram illustrating a design workstation used for circuit, layout, and logic design of a fin-based structure according to one configuration.

FIG. 11 is a block diagram illustrating a design workstation used for circuit, layout, and logic design of an IC structure, such as the IC device with fluorinated spacers. A design workstation 1100 includes a hard disk 1101 containing operating system software, support files, and design software such as Cadence or OrCAD. The design workstation 1100 also includes a display 1102 to facilitate design of a circuit 1110 or an IC device 1112 including a complementary metal-oxide-semiconductor (CMOS) transistor. A storage medium 1104 is provided for tangibly storing the design of the circuit 1110 or the IC device 1112. The design of the circuit 1110 or the IC device 1112 may be stored on the storage medium 1104 in a file format such as GDSII or GERBER. The storage medium 1104 may be a CD-ROM, DVD, hard disk, flash memory, or other appropriate device. Furthermore, the design workstation 1100 includes a drive apparatus 1103 for accepting input from or writing output to the storage medium 1104.

Data recorded on the storage medium 1104 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1104 facilitates the design of the circuit 1110 or the IC device 1112 by decreasing the number of processes for designing semiconductor wafers.

For a firmware and/or software implementation, the methodologies may be implemented with modules (e.g., procedures, functions, and so on) that perform the functions described herein. Machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A method of fabricating an integrated circuit (IC) device, comprising:
   growing a first fluorocarbon spacer between a gate and a source contact;
   growing a second fluorocarbon spacer between the gate and a drain contact; and
   growing low-K spacers between the first fluorocarbon spacer and the source contact, and between the second fluorocarbon spacer and the drain contact.

2. The method of claim 1, in which growing the first fluorocarbon spacer and the second fluorocarbon spacer comprises:
   depositing a sacrificial catalyst layer on sidewalls of the gate;
   diffusing a low resistivity carbon alloy through the sacrificial catalyst layer;
   removing the sacrificial catalyst layer; and
   fluorinating the low resistivity carbon alloy.

3. The method of claim 2, in which the low resistivity carbon alloy comprises graphene.

4. The method of claim 1, in which growing the first fluorocarbon spacer and the second fluorocarbon spacer comprises:
   depositing a thin catalyst layer on sidewalls of the gate;
   decomposing carbonaceous precursors from the thin catalyst layer; and
   fluorinating a low resistivity carbon alloy.

5. The method of claim 1, in which the first fluorocarbon spacer and the second fluorocarbon spacer comprise fluorographene spacers.

6. The method of claim 1, in which a thickness of the first fluorocarbon spacer is at least 0.3 nanometers.

7. The method of claim 1, in which the IC device is integrated into a mobile phone, a set top box, a music player, a video player, an entertainment unit, a navigation device, a computer, a hand-held personal communication systems (PCS) unit, a portable data unit, and/or a fixed location data unit.

8. An integrated circuit (IC) device, comprising:
   a semiconductor structure;
   a source contact on the semiconductor structure;
   a drain contact on the semiconductor structure;
   a gate on the semiconductor structure;
   a first fluorocarbon spacer between the gate and the source contact;
   a second fluorocarbon spacer between the gate and the drain contact, the first fluorocarbon spacer and the second fluorocarbon spacer contacting sidewalls of the gate; and
   first means for spacing between the first fluorocarbon spacer and the source contact, and second means for spacing between the second fluorocarbon spacer and the drain contact.

9. The IC device of claim 8, in which the semiconductor structure comprises a fin, a planar transistor structure, or a gate all around (GAA) transistor structure.

10. The IC device of claim 8, integrated into a mobile phone, a set top box, a music player, a video player, an entertainment unit, a navigation device, a computer, a hand-held personal communication systems (PCS) unit, a portable data unit, and/or a fixed location data unit.

11. The IC device of claim 8, in which the first fluorocarbon spacer and the second fluorocarbon spacer comprise fluorographene spacers.

12. The IC device of claim 8, in which a thickness of the first fluorocarbon spacer is at least 0.3 nanometers.

* * * * *